(12) United States Patent
Kernahan

(10) Patent No.: US 12,113,476 B2
(45) Date of Patent: Oct. 8, 2024

(54) SYSTEM AND METHOD FOR CONFIGURING AN ARRAY OF SOLAR PANELS TO BE SAFE FOR HUMAN CONTACT

(71) Applicant: Kent Kernahan, Corvallis, MT (US)

(72) Inventor: Kent Kernahan, Corvallis, MT (US)

(*) Notice: Subject to any disclaimer, the term of this patent is extended or adjusted under 35 U.S.C. 154(b) by 355 days.

(21) Appl. No.: 16/501,400

(22) PCT Filed: Oct. 10, 2017

(86) PCT No.: PCT/US2017/055990
§ 371 (c)(1),
(2) Date: Oct. 7, 2019

(87) PCT Pub. No.: WO2018/068057
PCT Pub. Date: Apr. 12, 2018

(65) Prior Publication Data
US 2022/0149781 A1      May 12, 2022

Related U.S. Application Data

(60) Provisional application No. 62/405,825, filed on Oct. 7, 2016.

(51) Int. Cl.
*H02S 40/32* (2014.01)
*G01R 31/66* (2020.01)
*H02S 40/36* (2014.01)
*H02S 50/10* (2014.01)

(52) U.S. Cl.
CPC ............ *H02S 40/32* (2014.12); *G01R 31/66* (2020.01); *H02S 40/36* (2014.12); *H02S 50/10* (2014.12)

(58) Field of Classification Search
CPC .......... H02S 40/32; H02S 40/36; H02S 50/10; G01R 31/66
See application file for complete search history.

(56) References Cited

U.S. PATENT DOCUMENTS

| | | | |
|---|---|---|---|
| 8,884,465 B2* | 11/2014 | Sarhan | H02M 1/32 307/77 |
| 2004/0080962 A1* | 4/2004 | Charych | H02M 3/33515 363/21.11 |
| 2010/0116325 A1* | 5/2010 | Nikoonahad | H01L 31/02021 136/251 |

(Continued)

*Primary Examiner* — Thang X Le
*Assistant Examiner* — Haidong Zhang
(74) *Attorney, Agent, or Firm* — Phillip M. Wagner; Michael W. Caldwell

(57) ABSTRACT

A system comprising an array of solar panels, each panel including an electronic control module, wherein the panels are all connected in electrical series with each other and to a switch and to a string inverter, may be signaled to power down each panel to a safe output at its output terminals. The method includes sensing output wave forms of a module to be the result of its own DC-DC converter output or to be at variance with the expected output. Output wave forms at variance indicate that the control module is connected in electrical series with the input capacitance of the string inverter. If the output is as expected, the control module is deemed to not be connected to the capacitance of the string inverter as a result of the electrical series switch being open. The module then immediately drives its output to a safe level.

19 Claims, 12 Drawing Sheets

(56) References Cited

U.S. PATENT DOCUMENTS

| | | | |
|---|---|---|---|
| 2010/0288327 A1* | 11/2010 | Lisi | H02H 7/1222 |
| | | | 136/244 |
| 2012/0194003 A1* | 8/2012 | Schmidt | H02H 3/023 |
| | | | 307/116 |
| 2012/0205973 A1* | 8/2012 | McCaslin | H02J 3/46 |
| | | | 307/18 |
| 2014/0084687 A1 | 3/2014 | Dent | |
| 2014/0306540 A1* | 10/2014 | Wu | H02J 3/381 |
| | | | 307/77 |
| 2015/0136200 A1 | 5/2015 | Kernahan | |
| 2015/0280642 A1* | 10/2015 | Chisenga | H02S 50/10 |
| | | | 136/244 |
| 2016/0141878 A1 | 5/2016 | Johansen | |
| 2016/0190798 A1 | 6/2016 | Narla et al. | |
| 2017/0271875 A1* | 9/2017 | Narla | H02J 3/383 |

* cited by examiner

SYSTEM AND METHOD FOR CONFIGURING AN ARRAY OF SOLAR PANELS TO BE SAFE FOR HUMAN CONTACT

RELATED APPLICATIONS

This application is the 35 U.S.C. § 371 U.S. national phase of International Patent Application PCT/US2017/055990, having an international filing date of 10 Oct. 2017, which claims the benefit of priority to commonly owned U.S. Provisional Patent Application Ser. No. 62/405,825, filed 7 Oct. 2016, which is incorporated by reference herein in its entirely.

BACKGROUND

Solar panel systems are rapidly being deployed worldwide. There is a resulting problem of first responder safety. Whether or nota panel or array of panels is burning, many fire marshals and on-scene fire captains direct fire-fighting personnel to not go onto the roof of a structure to fight a fire due to the potentially lethal power that may be generated by a solar system. In some cases emergency crews even have been directed to not enter a building due to the danger of a roof collapse. Fire fighters may be injured or killed by coming into contact with solar panels or with the system wiring. Panels generate power even when disconnected from the grid or a string inverter if there is light incident on the panels, whether from sunlight or on-scene lighting. Other systems have been suggested wherein switches or other devices are used to disconnect the system. However individual panels may continue to provide power at their terminals.

There is a need for the output terminals of each panel to be capable of being driven to a safe condition.

SUMMARY

Solar array systems typically comprise a plurality of photovoltaic panels with their direct current outputs electrically connected in series as a string, with the series connected to a string inverter. This configuration is sometimes denominated as a "string array." The electrical input of a string inverter presents a significant capacitive load to the series-connected panels. If the absence of a capacitive load were detected, one could determine that the panels were not connected to the inverter. More generally, the apparatus and control method disclosed herein may be effective for determining if a panel or array of panels is or is not connected to a capacitive load.

In some embodiments, a disconnect switch may be connected in electrical series between an array of solar panels and a string inverter. Emergency personnel may be instructed to move the disconnect switch to the electrically open position before approaching a solar system, thereby electrically removing the capacitive load of the string inverter from the solar array wiring. This may be a signal to a controller on each panel to control the panel output to a safe condition.

A control apparatus, described hereinafter, provides a DC-DC output at a panel's terminals. The DC-DC output of each panel will naturally have some amount of AC ripple at the output terminals. The AC ripple may be the result of natural or intentional AC ripple from a switched DC supply driving a panel's output at the output terminals. When the capacitive load of the string inverter is present, the DC current from the solar array will include a small amount of AC ripple from each panel, imposed upon the common current. When the DC-DC converters associated with the panels are out of phase or otherwise not synchronized, which would be a typical arrangement, a given panel may sense a pattern of output voltage ripple which is different than the given panel would produce itself in isolation, i.e., a distorted output AC ripple only when the capacitive load of the string inverter is present. So long as the capacitive load of the string inverter is present, the AC ripple current of every electrical series-connected DC-DC converter associated with each solar panel will flow through every other electrical series-connected DC-DC converter in a common string. When a disconnect switch is opened, since the panels are electrically connected in series, the DC current and AC ripple current immediately drop to zero. Without the capacitive load of the string inverter to complete an AC circuit, each DC-DC converter can only detect its own AC ripple current and cannot detect the AC ripple current of any other DC-DC converter. That is, the panels are then open circuit. In this case, a panel is only able to sense its own AC ripple voltage output across its terminals.

By comparing the AC ripple a controller creates itself with the instant AC ripple electrical signal seen across its output terminals, a panel controller may be configured to determine if it is or is not connected to a significant capacitive load. If the AC ripple is as predicted, the panel is not connected; if the AC ripple is determined to be different, it is connected to a significant capacitive load and may also be connected in electrical series with other panels.

In some embodiments a current-based tone generator is connected in electrical series with the panels. A controller may be configured to determine if it senses the tone. Because of the series electrical configuration, if the tone is detected, the series circuit is complete. If no tone is detected, it is not.

At the system level, a method is disclosed for a combination of human action and automatic electronic response to render a solar panel array safe to contact and even for penetration by, for example, a fire ax or chain saw, often used to provide roof ventilation in fighting a fire. The method comprises the steps of an emergency responder operating a disconnect switch, thereby opening an electrical series connection to a string inverter. The system then responds by powering down the output of each panel, rendering the system and system wiring safe for human contact. In some embodiments, the output of each panel is actively driven to and held at a low, safe level.

As described herein, one aspect of this innovation involves determining whether a solar panel is connected to a capacitive load by employing a processor having an input terminal and an output terminal, the processor output terminal operatively connected to a DC-DC converter having an output terminal, the processor further including program memory to comparing the DC-DC converter output signal to a predetermined output signal; and an analog to digital converter connected to the output terminal of the DC-DC converter, wherein the analog to digital converter provides to the processor a digital representation of the value of voltage signals on the DC-DC converter. In one embodiment, the analog to digital converter is integrated within the processor.

Another aspect of this innovation involves improving a solar panel system comprising a plurality of solar panels each having an input terminal and an output terminal electrically connected in series with a string inverter by including in the solar panel system at least one disconnect switch electrically connected in series with the plurality of solar panels and the string inverter; and including in at least one of the panels a processor having an input terminal and an output terminal, the processor output terminal operatively connected to a DC-DC converter having an output terminal, the processor further including program memory to perform the steps of comparing an output signal from the DC-DC converter output terminal to a predetermined output signal and optionally driving the output of the DC-DC converter to a safe output voltage value; and an analog to digital converter connected to the output terminal of the DC-DC converter, wherein the analog to digital converter provides to the processor a digital representation of the value of voltage signals on the DC-DC converter: The analog to digital converter may be integrated within the processor. The safe output voltage value is compliant with the standard NEC 2014 690.12, or alternatively, it is less than 30 volts. The safe output voltage value may be attained within less than one second after opening the disconnect switch. At least one solar panel in the series may be configured as described above, or multiple solar panels in the series may be so configured, or all of the solar panels in the series may be so configured.

Another aspect of this innovation involves improving a solar panel system comprising a plurality of solar panels each having an input terminal and an output terminal electrically connected in series with a string inverter by including in the solar panel system at least one disconnect switch electrically connected in series with the plurality of solar panels and the string inverter, and a tone generator; and including in at least one of the panels a current transformer in electrical series with the plurality of solar panels for providing the tone to a tone signal detector capable of generating an electrical control signal, and a control switch in series with the solar panel's terminals, wherein the control switch is responsive to the electrical control signal, thereby opening or closing the electrical series connection between the panels. The tone generator may be integrated into the string inverter. The tone signal detector may control the one or more control switches. At least one solar panel in the series may be configured as described above, or multiple solar panels in the series may be so configured, or all of the solar panels in the series may be so configured. The solar panel system may further include a coupling capacitor and a bleed resistor electrically in parallel with the terminals of each solar panel having a tone detector and a current transformer, thereby providing an electrical path for the electrical tone signal when the disconnect switch is closed-after having been open. The tone signal detector may include a processor and an analog to digital converter. The tone signal detector may comprise an integrated circuit having an input terminal, and having an output terminal responsive to an electrical tone signal with an expected frequency received at its input terminal.

BRIEF DESCRIPTION OF THE DRAWINGS

The accompanying drawings, which are incorporated herein and constitute part of this specification, illustrate exemplary aspects of the inventive concept, and, together with the general description given above and the detailed description given below, serve to explain features of the inventive concept.

DETAILED DESCRIPTION

Figure 1:
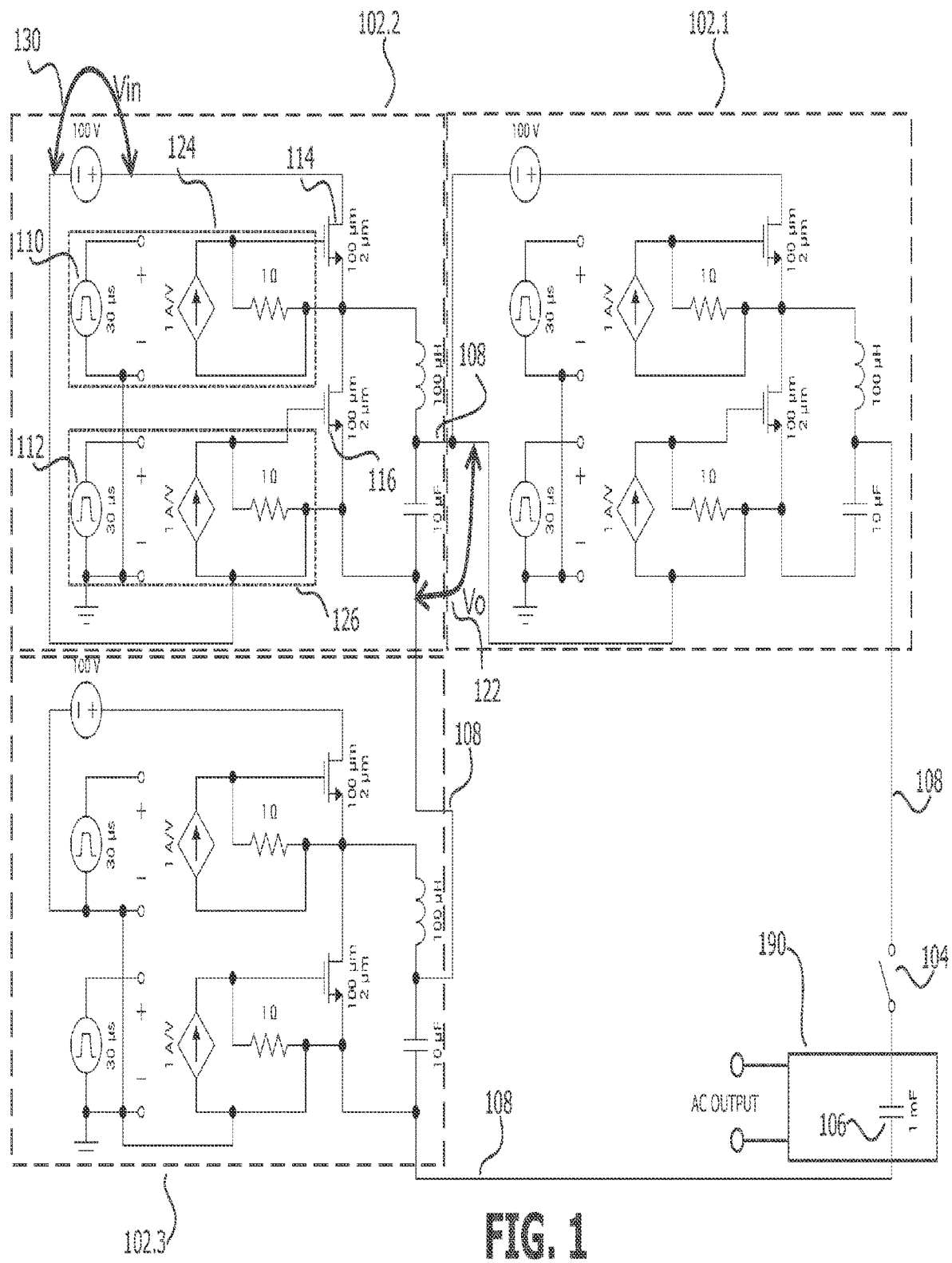
FIG. 1 is a schematic of an example of a solar array comprising three solar panels, including a model of the electronics within a control module controlling each panel, wherein the control modules are electrically connected in series with each other, a disconnect switch, and a capacitive load.

Definition of Some Terms:

| Term | Definition |
| --- | --- |
| Insolation | Irradiance due to solar radiation. Expressed in watts/meter$^2$. |
| One Sun | Industry standard of irradiance, defined as 1,000 watts/meter$^2$. |
| NOCT | Normal Operating Cell Temperature: the expected temperature of a PV during operation at specified conditions. |
| STC | Standard Test Conditions: the condition of a PV during manufacturing test. |

-continued

| Term | Definition |
| --- | --- |
| Tp | Time duration of power FET ON signal in a switching power converter. Tp is a portion of T, the period of the switching frequency. |
| PV | Photovoltaic panel, often called a "solar panel", comprised of electrically connected individual photovoltaic cells. |
| MHO | One MHO is equal to the reciprocal of one ohm, and is sometimes referred to as one "siemens." |
| Duty cycle | For a switching power converter, Tp/T or, ON time numerically divided by frame time. |
| Cell string | A plurality of solar cells electrically connected in series. |

In the instant disclosure, the plural may apply to the singular, and the singular may apply to the plural in all references and in the description. In some instances an element may be repeated in more than one location of a drawing, sometimes denominated with "n" to indicate an instance number. "n" may represent a single instance or location as well as all of them with the same base number with the same meaning.

The terms "a" and "an" and variations thereof represent the phrase "at least one." In all cases, the terms "comprising," "comprises," "including," "includes," "contains," "having," and any variations thereof should not be interpreted as limited to the elements listed thereafter but rather as open-ended terms, as though the phrase "at least" were appended thereafter.

The conjunction "or" is to be construed inclusively (i.e., one, another, or both), unless it is explicitly stated otherwise (e.g., by use of "either . . . or," "only one of," or similar language) or two or more of listed alternatives are mutually exclusive within the particular context, in which case "or" would encompass only those combinations involving non-mutually exclusive alternatives.

The term "substantially" is to be construed as meaning something that effectively possesses the same property or achieves the same function as that of the stated limit, and includes exactly the stated limit as well as insignificant deviations therefrom.

The term "approximately" is to be construed as meaning something having very nearly the stated value, and includes exactly the stated value as well as insignificant variations therefrom.

Unless otherwise specified, all words used herein carry their common meaning as understood by a person having ordinary skill in the art.

In cases where examples are listed, it is to be understood that combinations of any of the alternative examples are also envisioned. The scope of the invention is not to be limited to the particular embodiments disclosed herein, which serve merely as examples representative of the limitations recited in the issued claims resulting from this application, and the equivalents of those limitations.

Various features may be grouped together in example embodiments for the purpose of streamlining the disclosure, but this method of disclosure should not be interpreted as reflecting an intention that any claimed embodiment requires more features than are expressly recited in the corresponding claim. Rather, as the appended claims reflect, inventive subject matter may lie in less than all features of a single disclosed example embodiment. Thus, the appended claims are hereby incorporated into the detailed description, with each claim standing on its own as a separate disclosed embodiment. However, the present disclosure shall also be construed as implicitly disclosing any embodiment having any suitable set of one or more disclosed or claimed features (i.e., a set of features that are neither incompatible nor mutually exclusive) that appear in the present disclosure or the appended claims, including those sets that may not be explicitly disclosed herein. Conversely, the scope of the appended claims does not necessarily encompass the whole of the subject matter disclosed herein.

If the word "means" or the phrase "step for" does not appear in a claim, applicant does not intend to invoke the provisions of law relating to "means/function" or "step/function" claiming.

The abstract is provided as required as an aid to those searching for specific subject matter within the patent literature. However, the abstract is not intended to imply that any elements, features, or limitations recited therein are necessarily encompassed by any particular claim. The scope of subject matter encompassed by each claim shall be determined by the recitation of only that claim.

FIG. 1 shows an electrical representation of three exemplary solar panels, each including a control module $102.n$, the control modules electrically connected in series on a common line 108 with a disconnect switch 104 and the input capacitance 106 of a string inverter 190. In some embodiments there are more than one disconnect switches 104. For example, there may be one at first-floor level on a structure for use by emergency personnel to cause a safe condition, and an additional disconnect switch 104 within the structure, such as a control room or attic.

Still looking at FIG. 1, the output of a single example module 102.2 is an output voltage Vo 122. The FIG. 1 schematic is used for purposes of simulation, an example of a suitable circuit which a person of ordinary skill in the art would appreciate. The elements 110 and 112 are shown as components, appropriate for a simulation. The solar panel output is represented by the voltage 122, for example 100 volts, which is Vin to a DC-DC converter. For clarity and consistency, the output voltage 130 of the solar cells is referred to hereinafter as "Vin", as the input voltage to the DC-DC converter. The input voltage 130 is connected to the high side of a power transistor 114, wherein the power transistor 114 is operated in cooperation with a sync transistor 116 to form a synchronous switching power supply output, usually denominated as a DC-DC output stage. The signals for the switching power supply, well known in the literature, may be provided by a controller 1402 (See FIG. 14) output terminals 110, 112, simulated by blocks 124 and 126, wherein the signal 110 drives the power transistor 114 for a time period Tp, then a sync pulse 112 drives the sync transistor 116 for a time Ts. This arrangement is commonly referred to as a "buck converter", in that the voltage output Vo 122 is lower than the supply voltage, here provided by the voltage source Vin 130, representing a high voltage received from a solar panel. Input voltage Vin 130 is shown as 100 volts, which has merely been arbitrarily selected for the purpose of simulation. Input voltage 130 may be any voltage, and of course will vary with load and Insolation. The buck converter of FIG. 1 is a synchronous DC-DC converter; a non-synchronous DC-DC converter may be used instead with provision of pulling the output down when in a low voltage (safe) condition. For a non-synchronous DC-DC converter the block 126 is not needed and the sync transistor 116 is replaced with a diode.

In FIG. 1 the disconnect switch 104 is shown as being open circuit. In this configuration the control modules 102.*n* cannot sense ("see") any information regarding the other panels/modules 102.*n* on the common string wire 108.

The system detects when a solar string array has been electrically detached from the input capacitance 106 of a string inverter. Being detached from the inverter input capacitance 106 may simply be due to a system fault, failure of a wire or connector, etc., in which case it would be advantageous for the system to enter a safe mode such that repair personnel or home owners are not injured when investigating the failure. However the condition of being electrically detached from the capacitance 106 of a string inverter , also may be used as a signal from emergency first responders to request that the system be placed into a safe mode so that they may, for example, safely go onto the roof of a burning building that has a solar system installed.

To describe the notion of multiple solar panels in an array of solar panels, FIG. 1 shows an example of three panels, each panel numerated as "102.*n*", wherein "n" is the number of a specific panel. Prior to discussion of recognition of a solar array connected to a capacitive load 106, discussion is first presented regarding the output of a specific module, for example 102.2, connected to a capacitive load 106; that is, that switch 104 is closed. Note that solar panels connected to a string converter are a direct current CI DC) electrical series connection. However the ripple produced by the controller 102.*n* outputs, being high frequency, may be considered as an alternating current ("AC") connection due to the input capacitance 106 of the string converter being very high.

Figure 2:
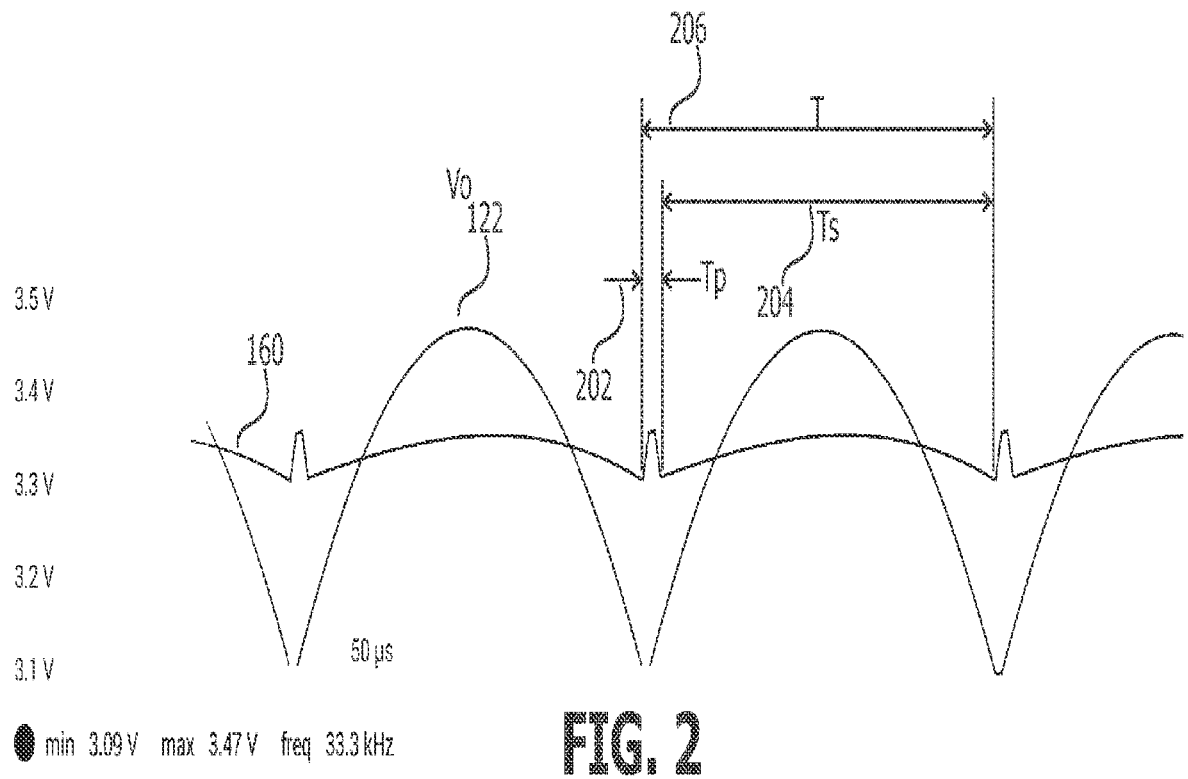
FIG. 2 shows an output voltage wave form of a single panel when the panel is not electrically connected to a significant capacitive load.

FIG. 2 is a simplified example of three solar panel output stages 102.*n*, where "n" may be any number of panels in electrical series, and in this example "n" is three. Panel 102.2 is described herein in more detail, but the description of panel output 102.2 applies to all output stages 102.*n*. Looking to FIG. 2, there is a ripple current on output voltage Vo 122 (see FIG. 1). For reference purposes, FIGS. 2, 3, 5, 6 and 7 also show the DC-DC converter drive pulses 160 on line 108. For clarity, the drive time by pulse 110 to the power transistor 114 is referred to as "Tp" 202. The sync pulse 112 to the sync transistor 116 is referred to as "Ts" 204. The total of the Tp 202 and Ts 204 pulse durations is "T"206, which is one divided by the switching frequency of the DC-DC converter.

Still looking to FIG. 2, note that the ripple on Vo 122 is very regular, as a typical open circuit switching power supply would present, i.e., when a DC-DC supply has no load. This output Vo ripple 122 can be very well anticipated by the controller 1402. An analog to digital converter "ADC" 1404, either instantiated in the controller 1402 which provides the output signals 110, 112, or alternatively implemented as an external ADC with a MUX for channel selection or other means of conversion of an analog signal to a digital representation, provides the output ripple data to the controller 1402 at regular conversion intervals. Many other methods of analog to digital conversion will be known by one of ordinary skill in the art, including the discharge of a capacitor connected to a digital input and timing the time from a logical low to a logical high, as but one example. A method of control is disclosed hereinafter.

Figure 3:
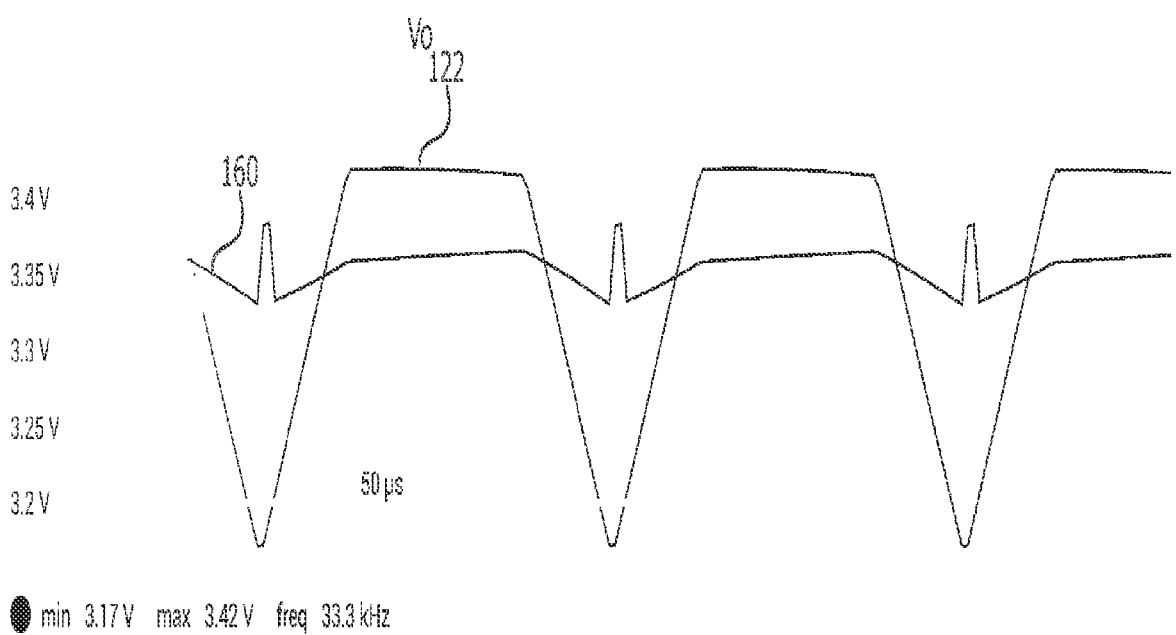
FIG. 3 shows output voltage wave forms of a single panel when the panel is electrically connected in series with an array of panels that are electrically connected in series with a disconnect switch and a capacitive load, with no particular phase relationship between the panels.

However, if the disconnect switch 104 is closed, all of the modules 102.*n* are connected in electrical series with each other. Because all of the module 102.*n* outputs are connected together, each module 102.*n* output 122 is affected by the ripple generated by all of the other modules 102.*n* on the string 108. FIG. 3 is an example of the output signal 122 of a module 102.*n* (note that this is a single module 102.*n* output) that is modified by the ripple of the other panels, the other panels having no particular phase relative to any other panel 102 on the string 108, or even the exact switching frequency as the instant module 102.2. A module 102.2 may simply examine its output ripple shape and, if the shape is as expected from its own DC-DC converter, as show9 in FIG. 2, then it is known that the module 102.2 is not connected in electrical series with the string inverter input capacitor 106. This is a condition that may be used as a trigger condition indicating that the module 102.2 should immediately power down to a safe condition. If, however, the output voltage does not match the expected output of FIG. 2 in any respect, then it is safe to continue high power operation or, in the case of daily start up as the sun rises, to simply begin a normal operational mode.

Figure 4:
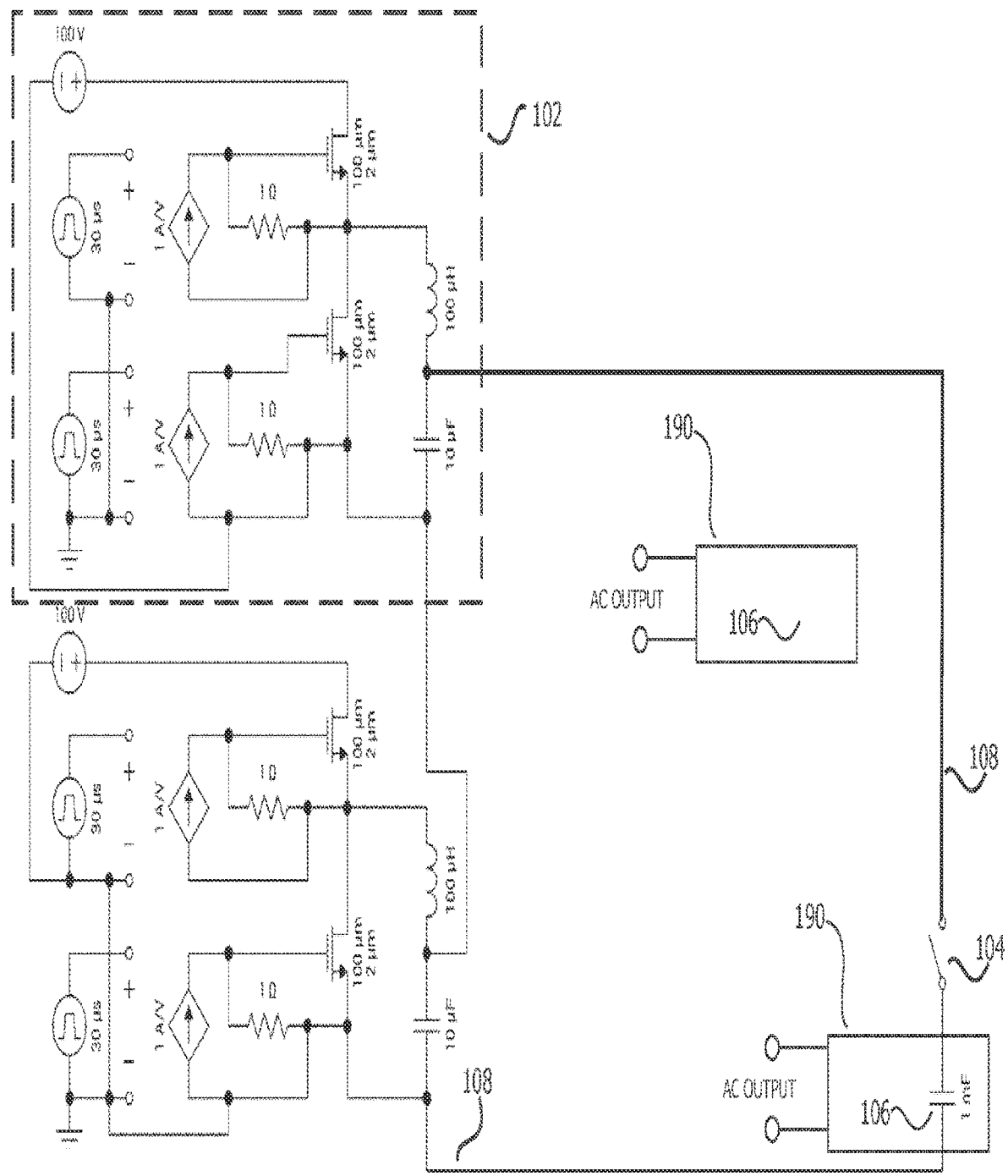
FIG. 4 is an example comprising two solar panel control modules electrically connected in series with one another and a disconnect switch and a capacitive load.
Figure 5:
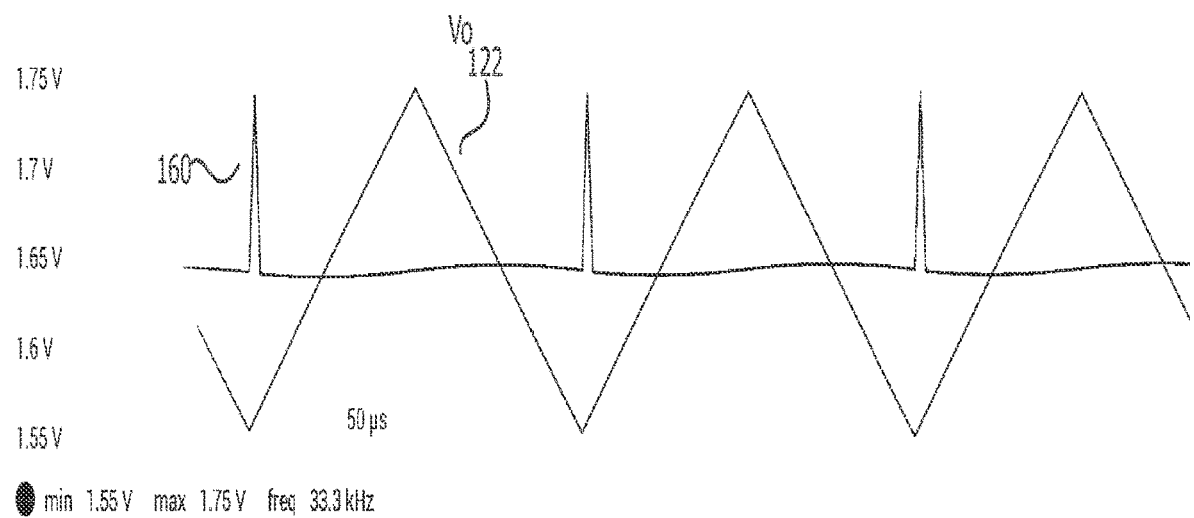
FIG. 5 is related to the modules shown in FIG. 4, wherein the output voltage signals have identical periods and are perfectly 180 degrees out of phase.

The system allows for corner conditions. Extreme conditions were examined to determine if the system detects an open disconnect switch 104. FIG. 4 is a simple case of just two modules, for example 102.1 and 102.2, in electrical series on the string 108. FIG. 5 shows the case of the two modules, for example module 102.1 being exactly in phase with exactly the same switching frequency as module 102.2. The wave shape of the output voltage 122 is nothing like the expected output of FIG. 2, thus the system would conclude that the module 102.2 is connected to the string inverter capacitance 106.

Figure 6:
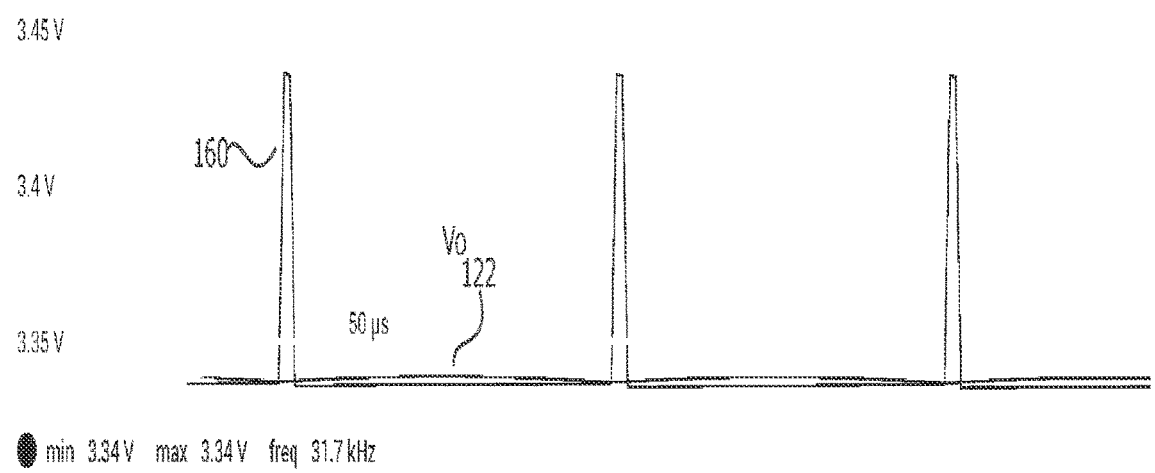
FIG. 6 is related to the modules shown in FIG. 4, wherein the output voltage signals have identical periods and are perfectly in phase.

Next, FIG. 6 considers the condition wherein again the two modules 102.1 and 102.2 of FIG. 4 have exactly the same switching frequency, but are 180 degrees out of phase. The output signal 122 does not match the output signal of FIG. 2, so again the determination is that the module 102.2 is connected to the capacitance 106 of the string inverter.

Figure 7:
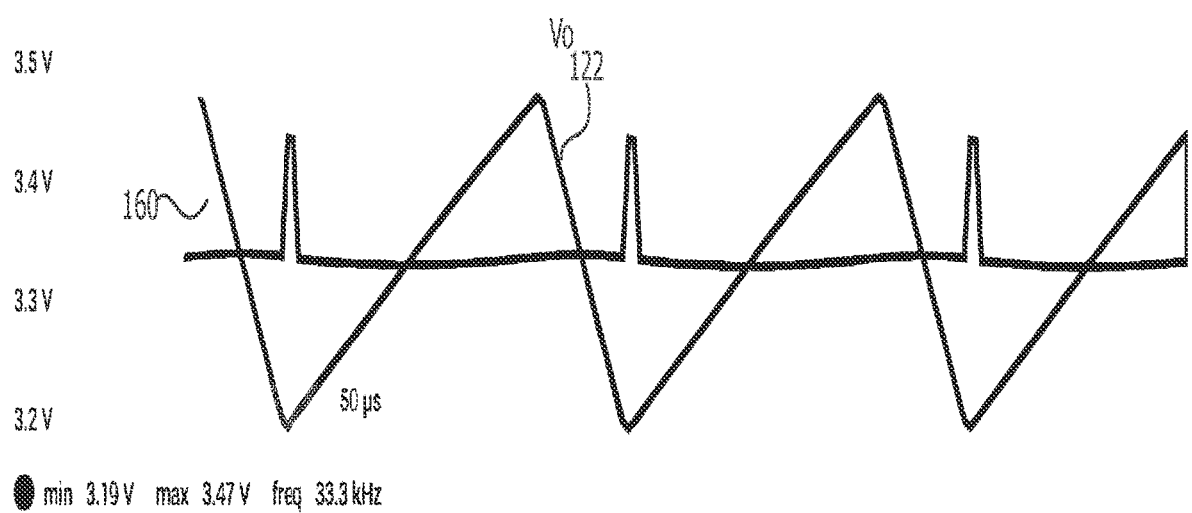
FIG. 7 is related to the modules shown in FIG. 4, wherein the output voltage signals have identical.periods and are perfectly 90 degrees out of phase.

Finally, FIG. 7 represents the condition wherein the two modules 102.1 and 102.2 of FIG. 4 have exactly the same switching frequency, but are 90 degrees out of phase with each other. The wave shape does not look like that of FIG. 2, so once again the determination would be that the module 102.2 is connected to the capacitance 106 of the string inverter.

Figure 12:
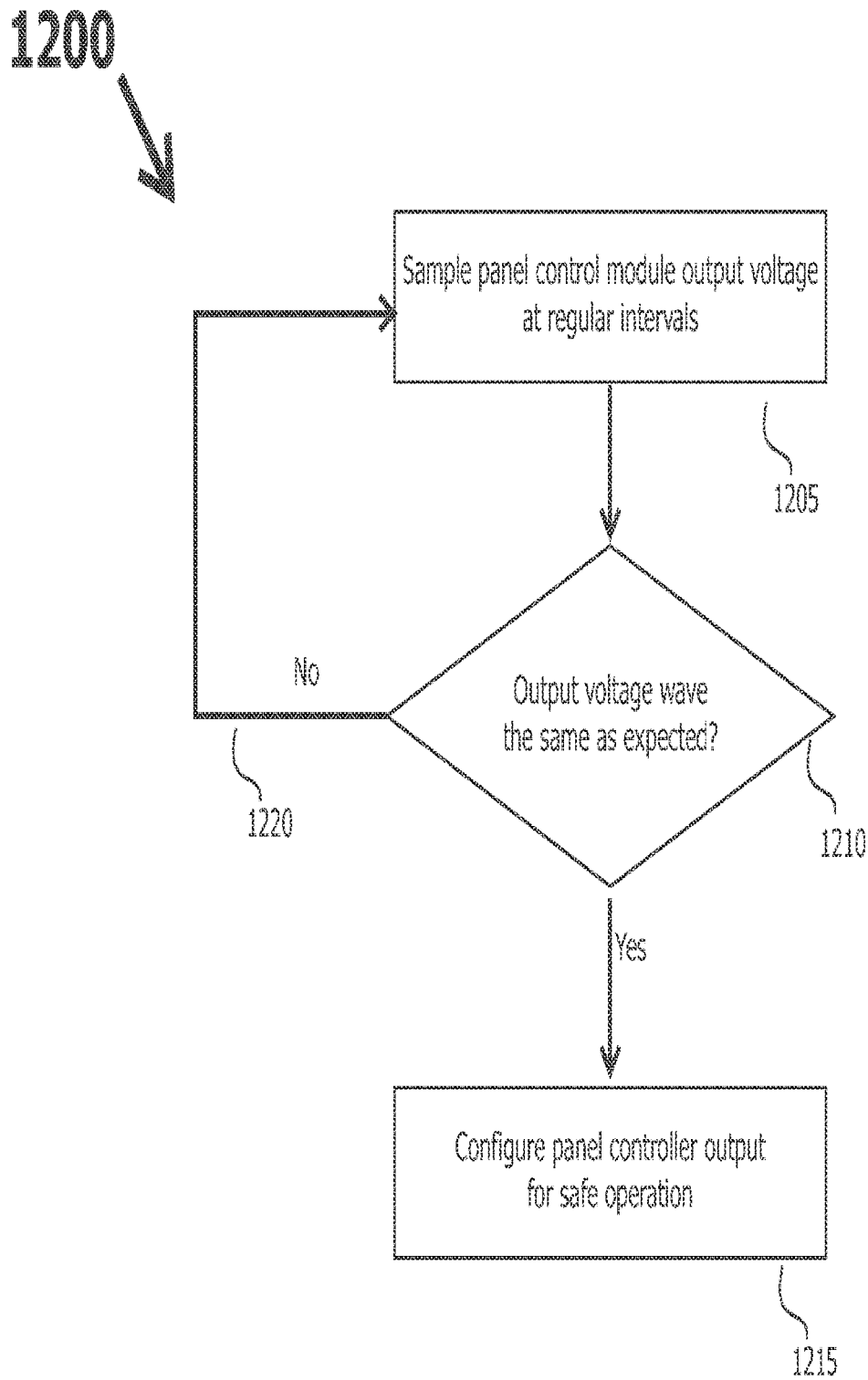
FIG. 12 is a flow chart of the logical steps performed by the control module of each solar panel to determine if the panel is connected to a capacitive load and take appropriate action, if any.

FIG. 12 describes the method of using the processes described herein before to determine if a system should be configured for a safe condition. At step 1205, ADC 1404 samples output voltage Vo 122 of its associated module 102, providing the value to the controller 1404. The output is compared to the expected output 1210, per FIG. 2. If the output 122 is not as expected from its own DC-DC converter, the sample process simply returns 1220 for another sample and standard operation of the solar system continues. If, however, the expected output is detected, as in FIG. 2, the program branches to step 1215 to configure for safe operation. In some embodiments safe operation is created by shortening the Tp pulses to the DC-DC converter, with the desired effect of lowering the output voltage to a safe level. A lower output, for example 2 volts, and a lower switching frequency may produce ripple that will be more detectable by other modules 102.n in the system if or when the disconnect switch 104 is again closed. Note that the panels are not simply disconnected from the string 108, but are instead driven to a low power condition, thereby permitting detection of disconnect switch 104 again being closed. In some embodiments the output voltage of each panel will drop below thirty (30) volts in as little as approximately one second after the disconnect switch 104 has been opened.

In some embodiments, other techniques are used at step 1210 to determine if the expected output as presented by FIG. 2 is present. For example, in some embodiments the time of the peak voltage 122 is recorded for a given period T. If the peak time in subsequent time periods is not consistent, it is evidence of a connection to the capacitance of the string inverter. In another method, output voltage 122 is measured at the same, regular offset time from a pulse, for example a power pulse Tp, and if the found voltage is not consistent, it may be considered evidence of a connection to the capacitance 106. The fundamental principle is that a module 102.n output 122 will naturally be at variance with respect to the expected signature (FIG. 2) if other modules 102.n also are running operationally and all are connected to the capacitance 106. If not, it is the result of the capacitance 106 not being electrically connected. As a result, each module 102 output is simply open circuit, and unable to influence, be influenced by, or otherwise detect any other module 102.n on string 108.

Figure 13:
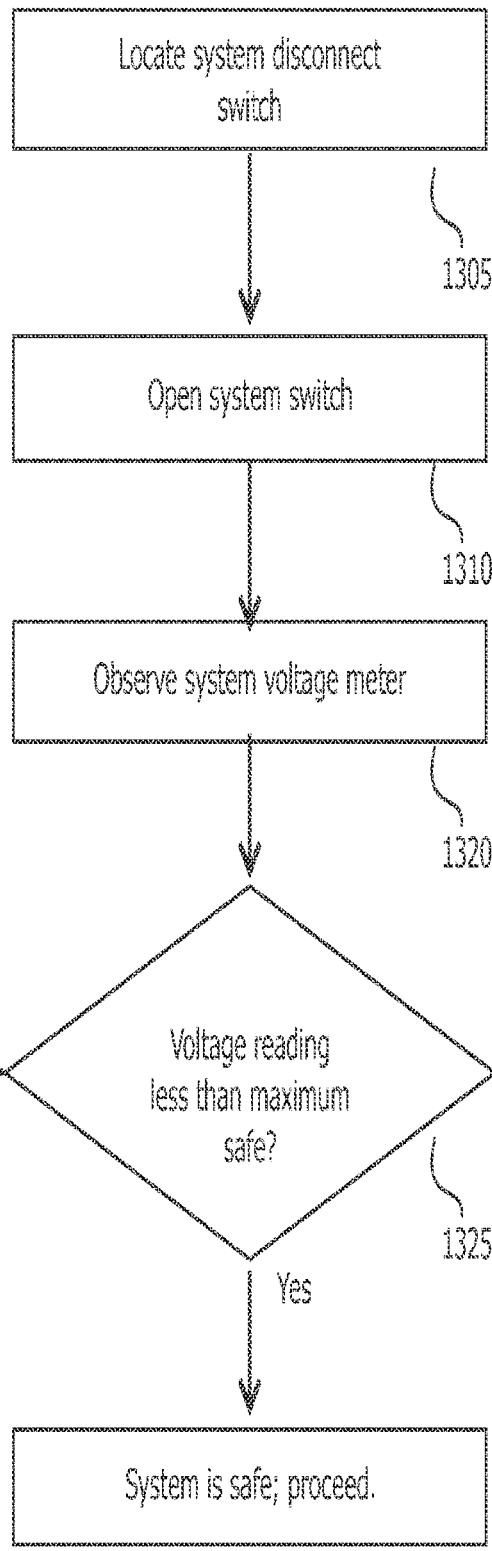
FIG. 13 is a flow chart of a procedure used by emergency first responders to render a solar system safe.

FIG. 13 represents a method of using the system as described hereinbefore by first responder emergency staff. After locating 1305 the disconnect switch 104, the disconnect switch 104 is opened 1310 per instructions on the switch. A voltage meter may be provided for verification that the system is indeed powered down to a safe level by measuring the voltage across the capacitor 106 on line 108. "Safe level" is defined by various agencies and is evolving over time. Voltages ranging from 25 VDC to 60 VDC are specified by various agencies in various countries. In the United States the requirement is covered by UL UL60950-1 Safety Extra-Low Voltage (SELV) and NEC 690.12, stating 30 volts to be the maximum safe voltage, though the requirement may change. NEC 690.12 requires an SELV of below 30 VDC/240 VA to be attained in a maximum of ten seconds.

As stated hereinbefore, the output of each panel on its line 108 is connected in electrical series with a succeeding panel output stage. At step 1320 that voltage or display is observed. In some embodiments, rather than presenting the actual voltage, an indicator may be presented which is one color, for example red, if the system is unsafe for contact and another color, for example green, when safe. In some embodiments the indicator includes a word, for example "SAFE" or "NOT SAFE." The voltage is read 1325 or the indicator observed and a decision made. If the voltage is still high or the indicator is red, then the system is not safe and no further steps are anticipated by the first responder 1335. In some environments a knowledgeable person or even the home owner may periodically open the disconnect switch and observe that the system immediately becomes safe for contact, much the same as fire extinguishers are to be periodically inspected. If the system is seen to be safe, then the user may proceed as appropriate 1330.

Figure 8:
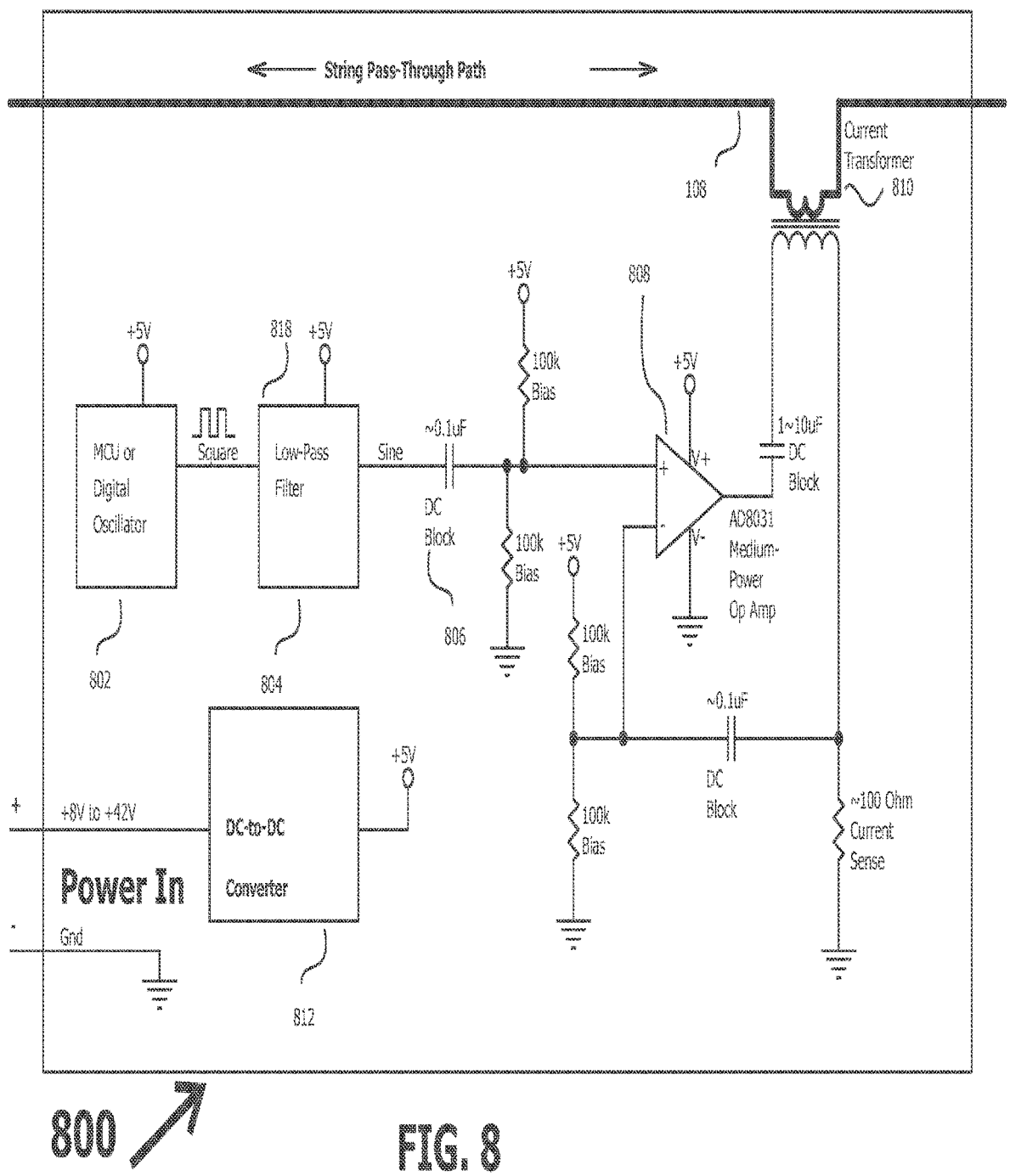
FIG. 8 is a schematic of an example of a current-based tone generator.
Figure 9:
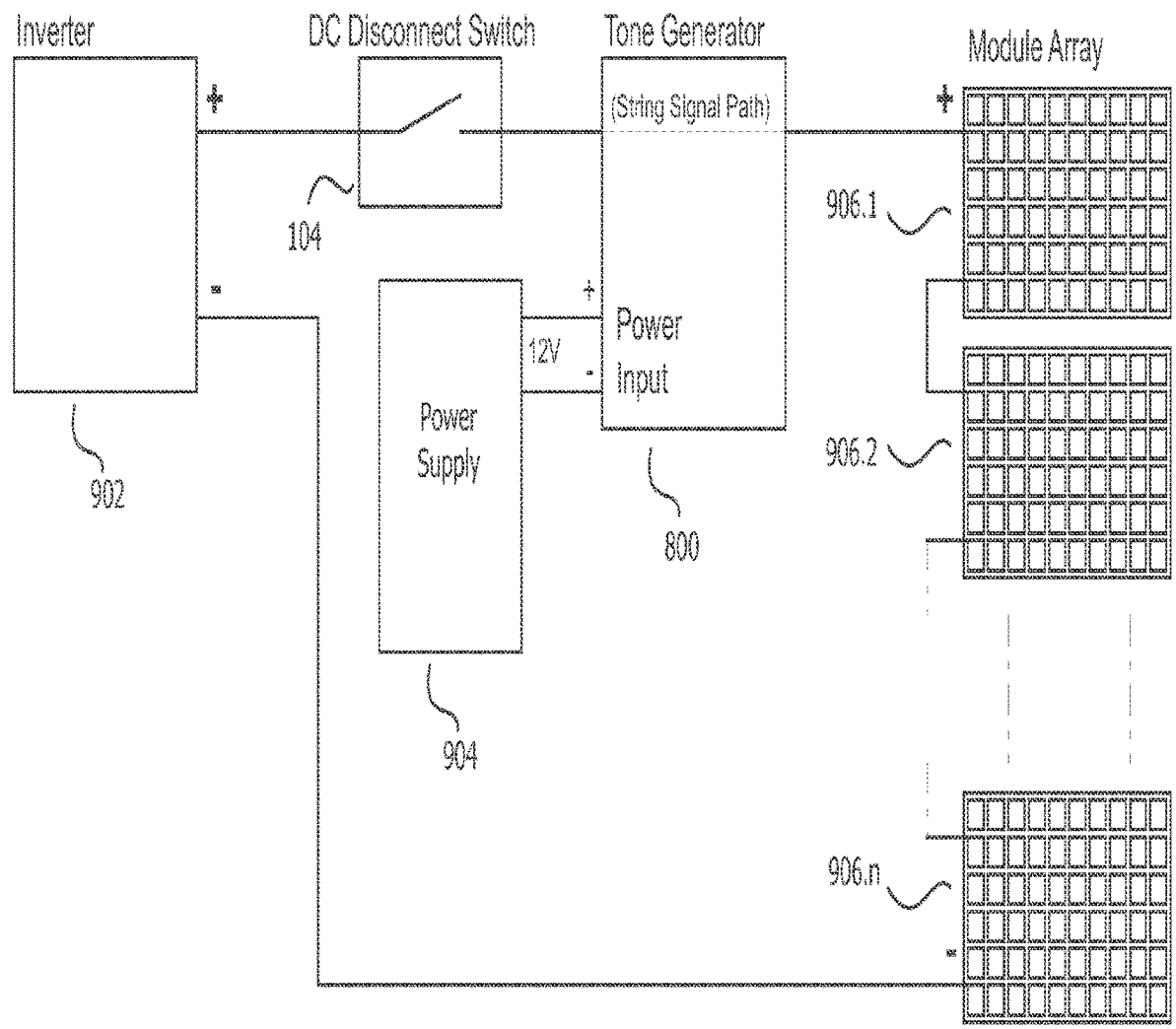
FIG. 9 is a schematic of a tone generator in a solar panel system wherein the tone generator is a stand-alone module.
Figure 10:
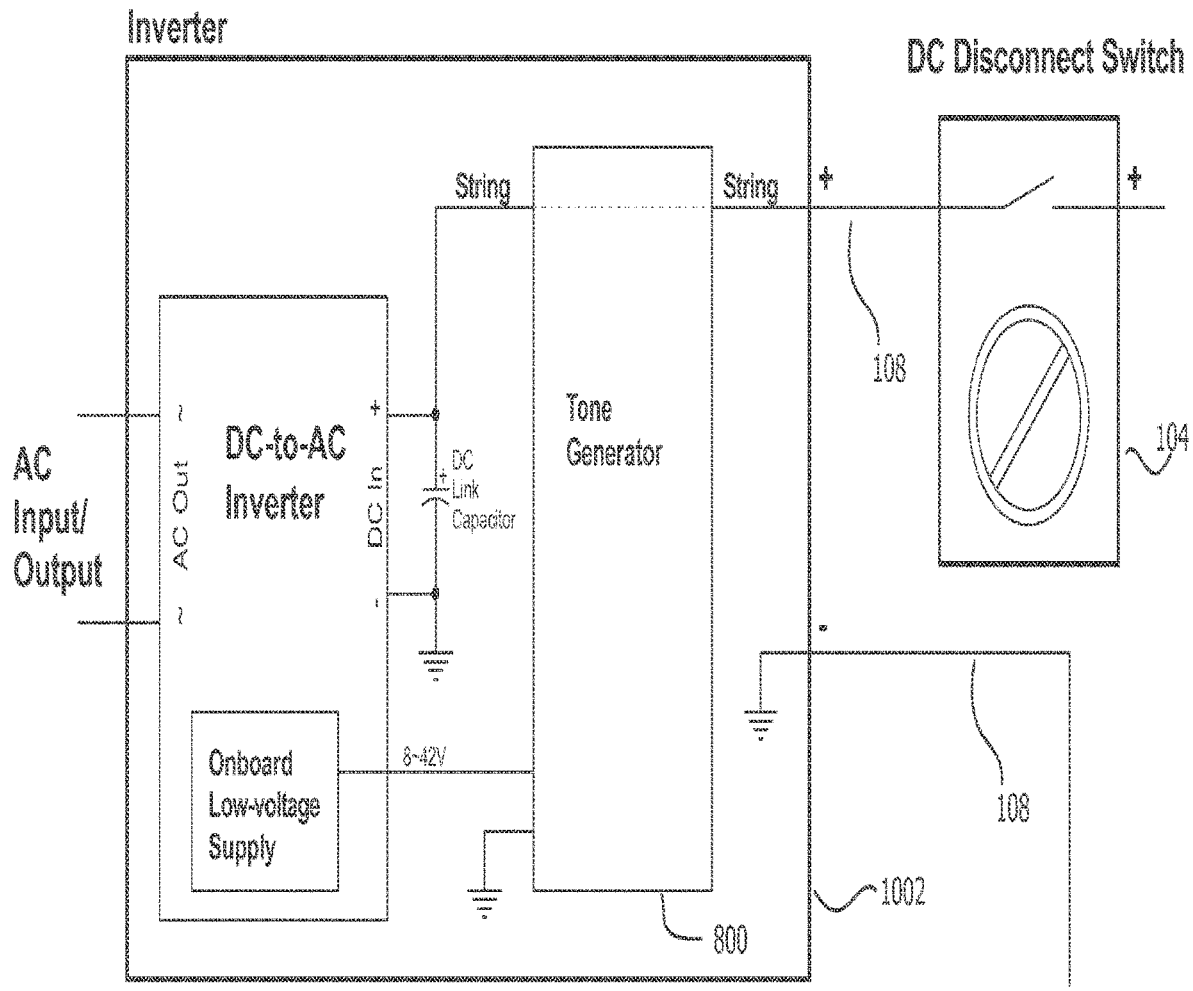
FIG. 10 is a schematic of a tone generator in a solar panel system wherein the tone generator is integrated within a string inverter.
Figure 11:
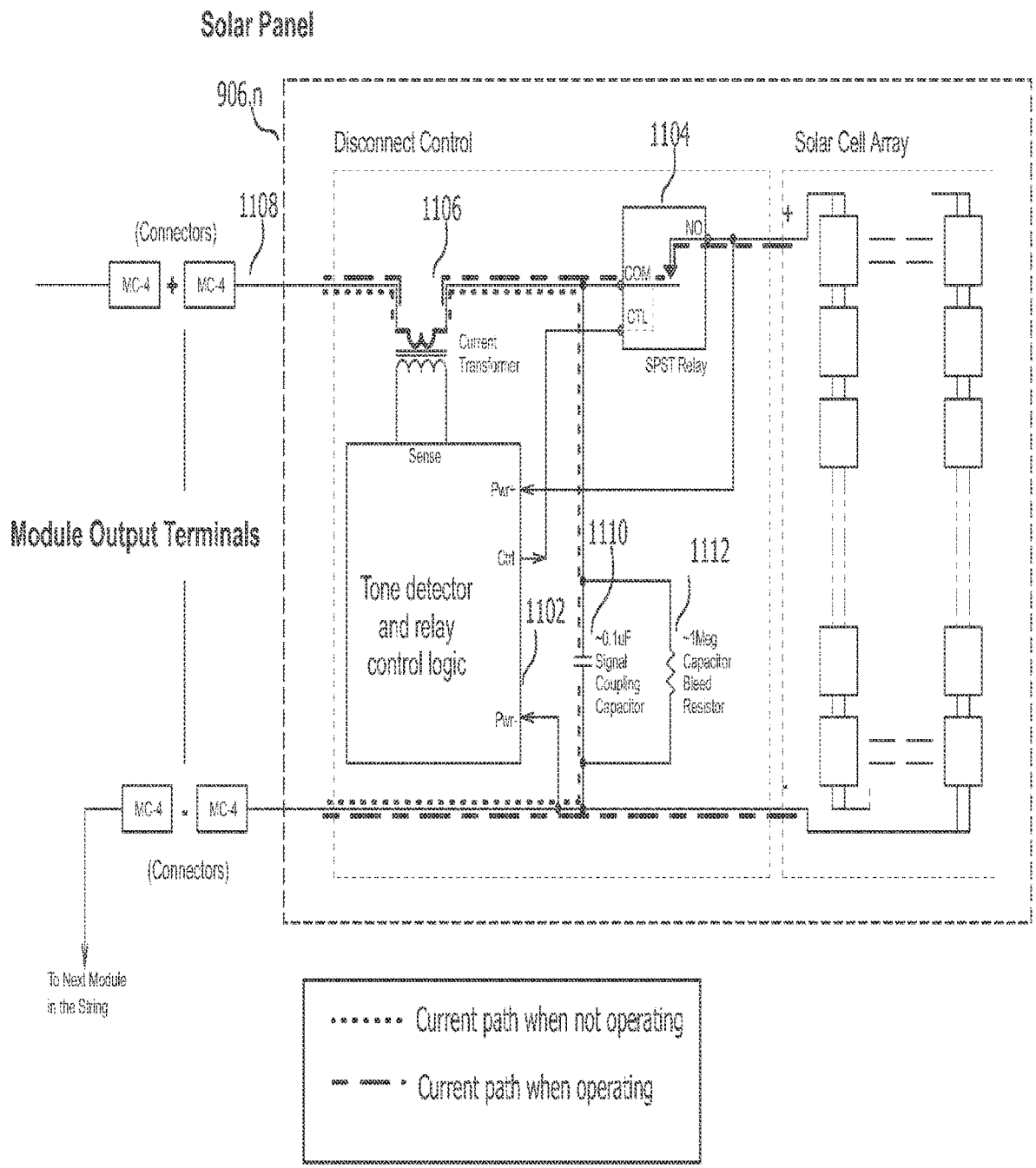
FIG. 11 is a schematic of a control module including a tone detector and disconnect logic connected to a solar panel that is electrically connected in series with all other panels in an array and with the string inverter and disconnect switch of FIG. 10.

In another embodiment a current-based tone generator is provided, and a tone detector is provided to a panel to respond to sensing or not sensing the tone. The tone generator 800 is presented in FIG. 8. As shown in FIG. 9, the tone generator 800 is in electrical series with the disconnect switch 104, then to the panel array 906.n. In one embodiment (FIG. 10) the tone generator 800 is instantiated in a string inverter 1002. FIG. 11 shows an example of a control system within a solar panel module, wherein relay logic 1102 (a tone detector), determines if the tone from the tone generator 800 is present or not, and may open an electrically series-connected control switch 1104 to disconnect the panel terminals from the string 108. A current transformer 1106 passes the DC power signal between panels and the inverter'902 but presents a version of the tone signal to the tone detector 1102. The tone detector, sometimes denominated as "relay control logic" 1102, detects the presence or not of a tone from the tone generator 800 on the series electrical path 1108 from the inverter 902 to the panels 906.n and back. In one example, the control logic 1102 is a processor with an ADC to receive the tone signal from the current transformer 1106 and provide a digital representation of the tone riding on the DC signal on the series connection 108. The ADC can be integrated within the processor, e.g., using a single chip, or connected to the prOcessor externally. In some embodiments the tone detector 1102 is an integrated circuit tone detector 1102, as but one example is the LM567C, available from Texas Instruments, Dallas, Texas. In the embodiment of FIG. 11 the tone detector 1102 is instantiated within each solar panel 906.n, thereby enabling all panels to detect a lack of tone on the common power line 108 DC signal, thus making each panel in the array safe. A coupling capacitor 1110 in parallel with a bleed resistor 1112 may be provided electrically in parallel across the output terminals of each solar panel, and electrically in series with the current transformer 1106, thereby permitting the tone to be detected when/if the disconnect switch 104 is again closed.

Figure 14:
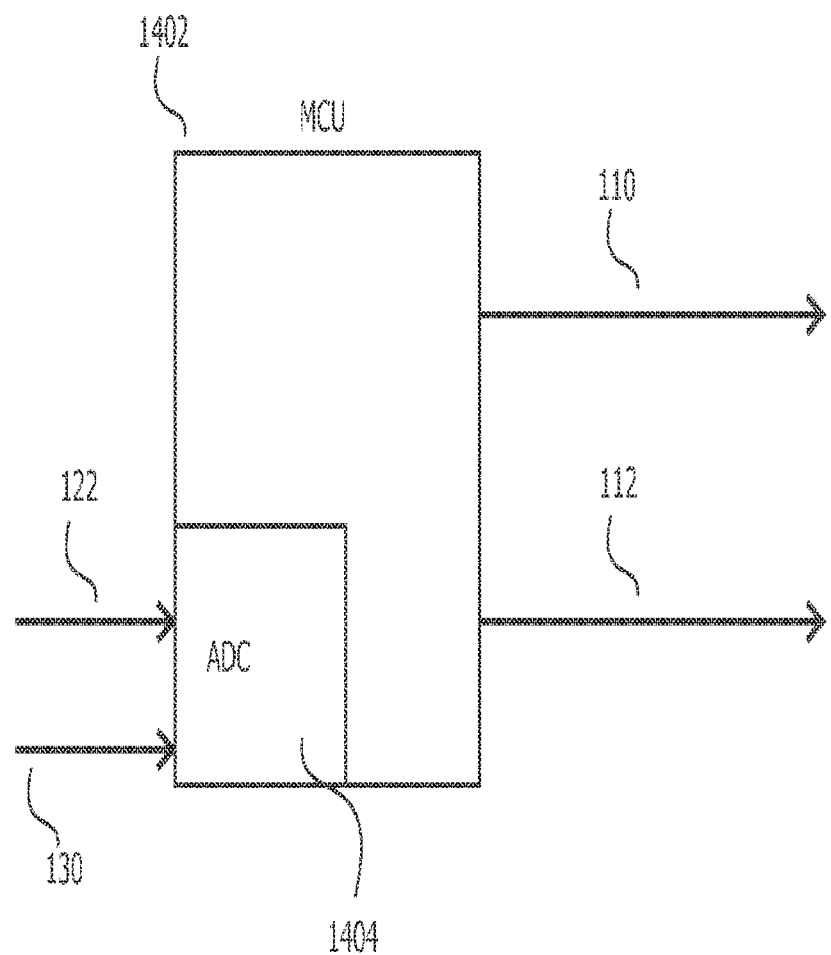
FIG. 14 is a block diagram of an exemplary control system for detecting signals on a panel output terminals and controlling the panel terminal voltage.

FIG. 14 shows an example of a control system. The control logic 1402 may be a preprogrammed microcontroller, an FPGA, discrete logic, an ASIC or other control means that one of ordinary skill in the art will know of. A MCU is shown as but one example.

RESOLUTION OF CONFLICTS

If any disclosures are incorporated herein by reference and such incorporated disclosures conflict in part or whole with the present disclosure, then to the extent of conflict, and/or broader disclosure, and/or broader definition of terms, the present disclosure controls. If such incorporated disclosures conflict in part or whole with one another, then to the extent of conflict, the later-dated disclosure controls

What is claimed is:

1. An apparatus comprising:
   a) a DC-DC converter having a DC-DC converter input terminal and a DC-DC converter output terminal;
   b) a processor having a processor input terminal and a processor output terminal, wherein the processor output terminal is operatively connected to the DC-DC converter input terminal, the processor further including program memory to perform the steps of:
      i) comparing a DC-DC converter output AC ripple voltage to an expected output AC ripple voltage for the DC-DC converter not electrically connected to a capacitive load from a string inverter; and
      ii) when the DC-DC converter output AC ripple voltage does not match the expected output AC ripple voltage, continuing a high power output from the DC-DC converter, otherwise driving the DC-DC converter to a safe output voltage; and
   c) an analog to digital converter having an analog to digital converter input terminal and an analog to digital converter output terminal, the analog to digital converter input terminal is connected to the DC-DC converter output terminal, the analog to digital converter output terminal is connected to the processor input terminal, and the analog to digital converter provides to the processor a digital representation of an output voltage from the DC-DC converter including the DC-DC converter output AC ripple voltage.

2. The apparatus of claim 1, wherein the analog to digital converter is integrated within the processor.

3. The apparatus of claim 1, wherein the safe output voltage is compliant with standard NEC 2014 690.12.

4. The apparatus of claim 1, wherein the safe output voltage is less than 30 volts.

5. The apparatus of claim 1, wherein the step of comparing the DC-DC converter output AC ripple voltage to the expected output AC ripple voltage includes comparing time periods between AC ripple peaks.

6. The apparatus of claim 1, wherein the step of comparing the DC-DC converter output AC ripple voltage to the expected output AC ripple voltage includes comparing time periods between synch pulses and AC ripple peaks.

7. The apparatus of claim 1, wherein the program memory further performs the step of optionally repeating step i) while the DC-DC converter has the safe output voltage.

8. The apparatus of claim 7, wherein the program memory further performs the step of optionally driving the DC-DC converter to output a voltage compliant with the standard NEC 2014 690.12.

9. In a solar panel system comprising a plurality of solar panels each having an input terminal and an output terminal electrically connected in series with a string inverter, the improvement comprising at least one solar panel comprising:
 a) a DC-DC converter having a DC-DC converter input terminal electrically connected to the output terminal of the at least one solar panel and a DC-DC converter output terminal;
 b) a processor having a processor input terminal and a processor output terminal, wherein the processor output terminal is operatively connected to the DC-DC converter input terminal; the processor further including program memory to perform the steps of:
  i) comparing a DC-DC converter output AC ripple voltage to an expected output AC ripple voltage for the DC-DC converter not electrically connected to a capacitive load from the string inverter; and
  ii) when the DC-DC converter output AC ripple voltage does not match the expected output AC ripple voltage, continuing high power output from the DC-DC converter, otherwise driving the DC-DC converter to a safe output voltage; and
 c) an analog to digital converter having an analog to digital converter input terminal and an analog to digital converter output terminal, the analog to digital converter input terminal is connected to the DC-DC converter output terminal, the analog to digital converter output terminal is connected to the processor input terminal, and the analog to digital converter provides to the processor a digital representation of an output voltage from the DC-DC converter including the DC-DC converter output AC ripple voltage.

10. The solar panel system of claim 9, wherein the analog to digital converter is integrated within the processor.

11. The solar panel system of claim 9, wherein the safe output voltage is compliant with the standard NEC 2014 690.12.

12. The solar panel system of claim 9, wherein the safe output voltage is less than 30 volts.

13. The solar panel system of claim 9, wherein said at least one solar panel is all the solar panels in the solar panel system.

14. The solar panel system of claim 9, wherein the step of comparing the DC-DC converter output AC ripple voltage to the expected output AC ripple voltage includes comparing time periods between AC ripple peaks.

15. The solar panel system of claim 9, wherein the step of comparing the DC-DC converter output AC ripple voltage to the expected output AC ripple voltage includes comparing time periods between synch pulses and AC ripple peaks.

16. The solar panel system of claim 9, wherein the program memory further performs the step of optionally repeating step i) while the DC-DC converter has the safe output voltage.

17. The solar panel system of claim 16, wherein the program memory further performs the step of optionally driving the DC-DC converter to output voltage not greater than thirty volts per the standard NEC 2014 690.12.

18. In a solar panel system comprising a plurality of solar panels each having an input terminal and an output terminal electrically connected in series with a string inverter, the improvement comprising at least one solar panel comprising:
 a) a DC-DC converter having an input terminal and an output terminal;
 b) a processor having an input terminal and an output terminal, wherein the processor output terminal is operatively connected to the DC-DC converter input terminal; the processor further including program memory to perform the steps of:
  i) comparing a DC-DC converter output AC ripple voltage to a predetermined output AC ripple voltage; and
  ii) optionally driving the DC-DC converter to a safe output voltage;
 c) an analog to digital converter having an input terminal and an output terminal, the analog to digital converter input terminal is connected to the output terminal of the DC-DC converter, the analog to digital converter output terminal is connected to the input terminal of the processor, and the analog to digital converter provides to the processor a digital representation of an output voltage from the DC-DC converter; and
 the safe output voltage is less than 30 volts and is attained within less than one second after opening a disconnect switch.

19. An apparatus, comprising:
 a) a DC-DC converter having an input terminal and an output terminal;
 b) a processor having an input terminal and an output terminal, wherein the processor output terminal is operatively connected to the DC-DC converter input terminal, the processor further including program memory to perform the steps of:
  i) comparing a DC-DC converter output AC ripple voltage to an expected output AC ripple voltage; and
  ii) driving the DC-DC converter to a safe output voltage;
 c) an analog to digital converter having an input terminal and an output terminal, the analog to digital converter input terminal is connected to the output terminal of the DC-DC converter, the analog to digital converter output terminal is connected to the input terminal of the processor, and the analog to digital converter provides to the processor a digital representation of an output voltage from the DC-DC converter; and the safe output voltage is less than 30 volts and is attained within less than one second after a disconnect switch electrically in series with the DC-DC converter output terminal and a string inverter is opened.

* * * * *